United States Patent
Morioka et al.

(10) Patent No.: US 10,271,465 B2
(45) Date of Patent: Apr. 23, 2019

(54) SYSTEM FOR COOLING ELECTRIC DRIVING UNIT OF AIRCRAFT

(71) Applicant: IHI Corporation, Koto-ku (JP)

(72) Inventors: Noriko Morioka, Tokyo (JP); Hitoshi Oyori, Tokyo (JP)

(73) Assignee: IHI Corporation, Koto-ku (JP)

( * ) Notice: Subject to any disclaimer, the term of this patent is extended or adjusted under 35 U.S.C. 154(b) by 0 days.

(21) Appl. No.: 15/370,791

(22) Filed: Dec. 6, 2016

(65) Prior Publication Data

US 2017/0086335 A1 Mar. 23, 2017

Related U.S. Application Data

(63) Continuation of application No. PCT/JP2015/070664, filed on Jul. 21, 2015.

(30) Foreign Application Priority Data

Sep. 3, 2014 (JP) .................. 2014-179172

(51) Int. Cl.
| | |
|---|---|
| *H05K 7/20* | (2006.01) |
| *B64D 13/06* | (2006.01) |
| *B64D 47/00* | (2006.01) |
| *B64D 13/08* | (2006.01) |
| *B64D 37/14* | (2006.01) |

(52) U.S. Cl.
CPC ......... *H05K 7/20863* (2013.01); *B64D 13/06* (2013.01); *B64D 13/08* (2013.01); *B64D 37/14* (2013.01); *B64D 47/00* (2013.01); *H05K 7/20* (2013.01); *H05K 7/202* (2013.01); *H05K 7/20136* (2013.01); *H05K 7/20209* (2013.01);

(Continued)

(58) Field of Classification Search
CPC ........ B64D 13/00; B64D 13/02; B64D 13/06; B64D 13/0614; B64D 13/08; B64D 13/14; H05K 7/20209; H05K 7/20945
See application file for complete search history.

(56) References Cited

U.S. PATENT DOCUMENTS

| | | |
|---|---|---|
| 5,513,500 A | 5/1996 | Fischer et al. |
| 5,998,896 A | 12/1999 | Early et al. |

(Continued)

FOREIGN PATENT DOCUMENTS

| | | |
|---|---|---|
| DE | 10 2007 052 818 A1 | 5/2009 |
| JP | 61-181800 | 8/1986 |

(Continued)

OTHER PUBLICATIONS

Moroney, Richard, "Ram-Air Cooling Systems for Aircraft Generators", Transactions of the American Institute of Electrical Engineers, Part II: Applications and Industry, vol. 76, No. 4, pp. 217-221, Sep. 1957.*

(Continued)

*Primary Examiner* — Robert J Hoffberg
(74) *Attorney, Agent, or Firm* — Oblon, McClelland, Maier & Neustadt, L.L.P.

(57) ABSTRACT

Heat exchangers are adjacent to electric driving units. Electric blowers of electric blower units rotate at rotational speed corresponding to amounts of heat generation of the electric driving units and suck air (ventilation air and outboard air). The sucked-in air passes through the heat exchangers that are adjacent to the electric driving units.

12 Claims, 2 Drawing Sheets

(52) U.S. Cl.
CPC . *H05K 7/20945* (2013.01); *B64D 2013/0614* (2013.01); *Y02T 50/56* (2013.01)

(56) References Cited

U.S. PATENT DOCUMENTS

| | | | |
|---|---|---|---|
| 7,414,339 B2* | 8/2008 | Kitamura | H02K 9/06 |
| | | | 310/58 |
| 7,540,141 B2 | 6/2009 | Goldberg et al. | |
| 8,540,188 B2* | 9/2013 | Nakagawa | B64C 13/42 |
| | | | 244/99.4 |
| 9,862,495 B2* | 1/2018 | Zywiak | B64D 13/06 |
| 2004/0261428 A1 | 12/2004 | Murry et al. | |
| 2008/0309175 A1 | 12/2008 | Telakowski | |
| 2011/0259546 A1* | 10/2011 | DeFrancesco | B64D 13/00 |
| | | | 165/42 |
| 2012/0014784 A1 | 1/2012 | Hipsky et al. | |
| 2012/0085860 A1 | 4/2012 | Nakagawa et al. | |
| 2012/0170657 A1 | 7/2012 | Wang et al. | |
| 2013/0076172 A1 | 3/2013 | Koyama et al. | |
| 2014/0232219 A1 | 8/2014 | Pal et al. | |
| 2014/0345305 A1* | 11/2014 | Sieme | B64D 13/08 |
| | | | 62/79 |
| 2015/0097078 A1 | 4/2015 | Mueller et al. | |
| 2015/0166186 A1* | 6/2015 | Zywiak | B64D 13/06 |
| | | | 165/279 |
| 2016/0306725 A1* | 10/2016 | Hare | G06F 11/2263 |
| 2016/0369706 A1* | 12/2016 | Suciu | F02K 3/115 |

FOREIGN PATENT DOCUMENTS

| | | |
|---|---|---|
| JP | 64-61999 | 3/1989 |
| JP | 11-324672 | 11/1999 |
| JP | 2008-312439 | 12/2008 |
| JP | 2012-25382 | 2/2012 |
| JP | 2012-81828 | 4/2012 |
| WO | WO 2013/123993 A1 | 8/2013 |

OTHER PUBLICATIONS

International Search Report dated Sep. 29, 2015 in PCT/JP2015/070664, filed on Jul. 21, 2015 (with English Translation).
Written Opinion dated Sep. 29, 2015 in PCT/JP2015/070664, filed on Jul. 21, 2015.
Extended Search Report dated Dec. 19, 2017 in European Patent Application No. 15837685.5.

* cited by examiner

SYSTEM FOR COOLING ELECTRIC DRIVING UNIT OF AIRCRAFT

CROSS REFERENCE TO RELATED APPLICATIONS

This application is a continuation application of International Application No. PCT/JP2015/070664, filed on Jul. 21, 2015, which claims priority to Japanese Patent Application No. 2014-179172, filed on Sep. 3, 2014, the entire contents of which are incorporated by reference herein.

BACKGROUND

1. Technical Field

The present disclosure relates to a system for cooling a unit that is installed into an aircraft and is electrically driven.

2. Description of the Related Art

The aircraft includes a gas turbine engine used as a propulsion device, a fuel tank, and a fuel pump that supplies fuel from the fuel tank to the gas turbine engine. This fuel pump is generally rotated (driven) with power of the engine that is transmitted via a gear box for auxiliary drive.

Accordingly, a rotational speed of the fuel pump is changed depending on a rotational speed of the engine. Since, in case of a fixed displacement pump such as a gear pump, a discharge flow rate of the pump is determined by the rotational speed of the engine, the discharge flow exceeds the fuel which is necessary for the engine combustion. Accordingly, a proposal in which the gear pump as the fuel pump is rotated by a dedicated electric motor is also made (see U.S. Pat. No. 7,540,141). If the gear pump is rotated by the electric motor, the rotational speed of the gear pump can be controlled not depending on the rotational speed of the engine.

SUMMARY

Incidentally, electric motors were introduced into the aircraft system for the purpose other than driving the fuel pump. For example, the electric motor is used for driving of a compressor and the like used in an environmental control system of a passenger cabin.

The electric driving units such as the electric motor of this kind and a drive circuit of the electric motor generate heat. Accordingly, cooling of the electric driving units is mandatory. Currently the electric driving units are cooled by using a liquid refrigerant. However, the liquid refrigerant is required to take sufficient measures for prevention of leakage from a refrigerant passage. Therefore, it is more advantageous to use, as the refrigerant, air that can alleviate such burden.

The present disclosure has been made in view of the aforementioned circumstances and an object of the present disclosure is to provide a system for cooling an electric driving unit of an aircraft that can efficiently cool the electric driving units of the aircraft with an air refrigerant.

One aspect of the present disclosure is a system for cooling an electric driving unit of an aircraft, including: at least one heat exchanger arranged adjacent to at least one electric driving unit installed in the aircraft, the heat exchanger configured to perform heat exchange with the electric driving unit; an electric blower configured to suck air through the heat exchanger for heat exchange and configured to exhaust the air to an outside of the aircraft; and a controller configured to control a rotational speed of the electric blower in accordance with an amount of heat generation of the electric driving unit.

The heat exchanger may be arranged in a pressurized region of the aircraft together with the electric driving unit, and ventilation air that is discharged to the outside from the pressurized region may be induced into the heat exchanger.

The heat exchanger may be arranged in an unpressurized region of the aircraft together with the electric driving unit, and ram air that has been taken in through an intake port in the aircraft may be induced into the heat exchanger.

The system for cooling an electric driving unit may further include a drive circuit for the electric blower; and a sub-heat exchanger arranged adjacent to the drive circuit, the sub-heat exchanger configured to perform heat exchange with the drive circuit, wherein the electric blower is configured to suck air guided to one of the heat exchanger and the sub-heat exchanger via the other and is configured to discharge the air to the outside of the aircraft.

The controller may control the rotational speed of the electric blower to optimize an amount of exhaust heat to the outside by the air sucked and discharged by the electric blower in accordance with the amount of heat generation of the electric driving unit.

The electric driving unit includes at least one of the electric motor and the drive circuit of the electric motor.

According to the present disclosure, the electric driving unit of the aircraft can be efficiently cooled with the air refrigerant.

DESCRIPTION OF THE EMBODIMENTS

Figure 1:
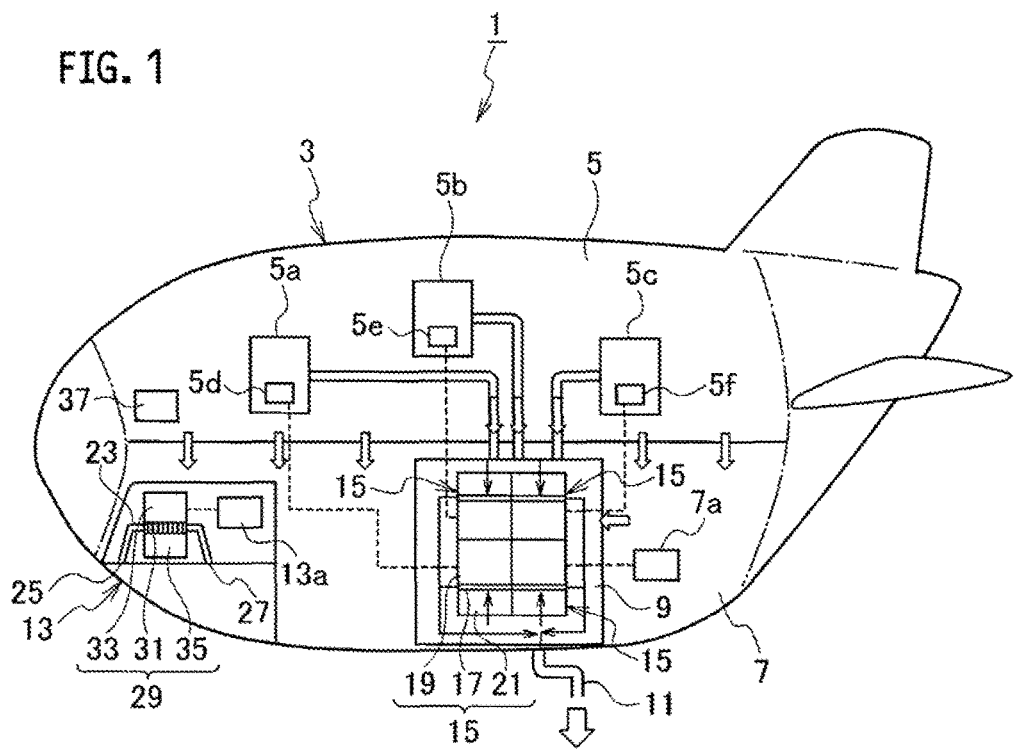
FIG. 1 is an explanatory diagram showing a system for cooling an electric driving unit of an aircraft according to a first embodiment of the present disclosure.

In the following, embodiments of the present disclosure will be described while referring to the drawings.

In an aircraft 1 of the first embodiment shown in the explanatory diagram of FIG. 1, a passenger cabin 5 is provided in an upper part of a fuselage 3 and a cargo compartment 7 that has been partitioned from the passenger cabin 5 is provided in a lower part of the fuselage 3. The passenger cabin 5 and the cargo compartment 7 are pressurized to a pressure that is close to the ground atmospheric pressure.

The cargo compartment 7 is provided with an electric room 9. Ventilation air that is discharged, for temperature control and ventilation, from lavatories 5a and 5b, a galley 5c, and the like of the passenger cabin 5 flows into the electric room 9. The ventilation air through the electric room 9 is discharged to the outside of the aircraft 1 via a ventilation passage 11.

Furthermore, a lower front part of the fuselage 3 is provided with a landing gear cavity 13 in which front landing gear (not shown) are housed. The landing gear cavity 13 is an unpressurized region that is separated from the passenger cabin 5 and the cargo compartment 7 (including the electric room 9) which are pressurized regions of the fuselage 3.

At least one cooling unit 15 is arranged in the electric room 9. In FIG. 1, an example in which four cooling units 15 are arranged is shown. Each of the cooling units 15 has a heat exchanger 17, an electric driving unit 19, and an electric blower unit 21. The electric driving unit 19 and the electric blower unit 21 are arranged adjacent to each other via the heat exchanger 17.

The heat exchanger 17 has fins for heat transfer (not shown) that makes contact with the ventilation air that flows from the lavatories 5a and 5b, the galley 5c, and the like of the passenger cabin 5 into the electric room 9. The heat exchanger 17 performs heat exchange between the electric driving unit 19 that is adjacent to the heat exchanger 17 and the ventilation air that passes through the inside of the heat exchanger 17. The ventilation air receives heat from the electric driving unit 19 while passing through the heat exchanger 17 and is then induced into the electric blower unit 21.

Each electric driving unit 19 includes a drive circuit (not shown) of an electric motor 7a that drives a compressor (not shown) and the like used in, for example, an environmental control system that conditions the air in the passenger cabin 5. The electric driving unit 19 may be the electric motor 7a itself and may include both of the electric motor 7a and the drive circuit thereof.

The electric motor 7a is installed in the aircraft 1 as a drive source for the compressor of the environmental control system and the like in place of a drive source such as oil pressure and air pressure used in conventional aircrafts. The electric motor 7a generates large heat in, for example, a coil part and the like therein. In addition, the drive circuit of the electric motor 7a generates large heat in high-voltage and high-frequency switching devices (for example, an IGBT, a MOSFET and the like) in the circuit. Accordingly, obtaining sufficient cooling is mandatory for the electric driving unit 19 that is constituted by the electric motor 7a and the drive circuit thereof, in ensuring stability of the operation.

Figure 2:
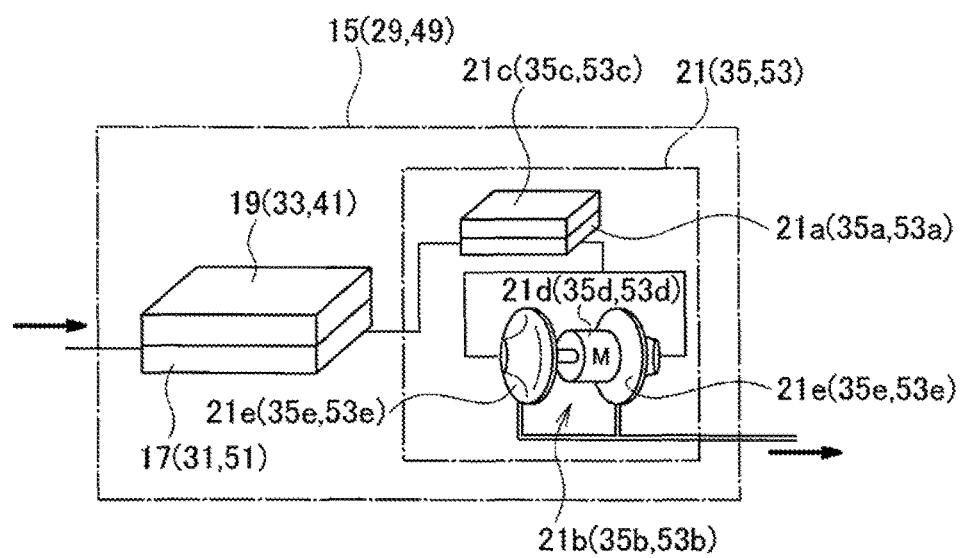
FIG. 2 is an explanatory diagram showing a schematic configuration of a cooling unit in FIG. 1.

As shown in FIG. 2, the electric blower unit 21 has a sub-heat exchanger 21a, an electric blower 21b, and a drive circuit 21c of the electric blower 21b. The ventilation air passes through the sub-heat exchanger 21a after having passed through the heat exchanger 17. After that, the ventilation air is sucked by the electric blower 21b. The drive circuit 21c is arranged adjacent to the sub-heat exchanger 21a. Note that a pathway through which ventilation air passes may be reverse to the above-mentioned one. That is, the ventilation air may pass through the heat exchanger 17 after having passed through the sub-heat exchanger 21a. In this case, the electric blower 21b sucks the ventilation air that has passed through the heat exchanger 17.

The sub-heat exchanger 21a has fins for heat transfer (not shown) that makes contact with the ventilation air after having passed through the heat exchanger 17. The electric blower 21b has an impeller 21e and an electric motor 21d that rotates the impeller 21e. When the impeller 21e is rotated by the electric motor 21d, the ventilation air after having passed through the sub-heat exchanger 21a is sucked into the electric blower 21b, is passed through a diffuser passage (not shown), and is discharged. The drive circuit 21c has the high-voltage and high-frequency switching devices (for example, the IGBT and the MOSFET and the like) that generate large heat similarly to the drive circuit of the electric motor of the electric driving unit 19.

Therefore, in the sub-heat exchanger 21a, heat exchange is performed between the drive circuit 21c that is adjacent to the sub-heat exchanger 21a and the ventilation air that passes through the inside of the sub-heat exchanger 21a. The ventilation air receives heat from the drive circuit 21c while passing through the sub-heat exchanger 21a, is then compressed by the electric blower 21b and is discharged to the outside of the aircraft from the electric room 9 via the ventilation passage 11.

As shown in FIG. 1, the landing gear cavity 13 is provided with an air passage 23. A door (not shown) of the landing gear cavity 13 is opened and thus outboard air flows into the landing gear cavity 13 and the air passage 23. The outboard air flows from an intake port 25 of the air passage 23 toward an exhaust port 27 of the air passage 23.

A cooling unit 29 is installed in the middle of the air passage 23. The cooling unit 29 has a heat exchanger 31, an electric driving unit 33, and an electric blower unit 35. The electric driving unit 33 and the electric blower unit 35 are arranged adjacent to each other via the heat exchanger 31.

The heat exchanger 31 has fins for heat transfer (not shown) that makes contact with the outboard air having been sucked in through the intake port 25 of the air passage 23 by the electric blower unit 35. The heat exchanger 31 performs heat exchange between the air that has been sucked in from the outside of the aircraft by the electric blower unit 35 and that passes through the inside of the heat exchanger 31 and the electric driving unit 33 that is adjacent to the heat exchanger 31. The air receives heat from the electric driving unit 33 while passing through the heat exchanger 31 and is then induced into the electric blower unit 35.

The electric driving unit 33 includes a drive circuit (not shown) of the electric motor 13a for, for example, ascending/descending front landing gear (not shown) from/to the landing gear cavity 13 and to drive wheels of the landing gear. Similarly to the electric driving unit 19, the electric driving unit 33 may be the electric motor 13a itself and may include both of the electric motor 13a and the drive circuit thereof. Since the electric motor 13a and the drive circuit thereof respectively generate large heat, obtaining sufficient cooling is mandatory also for the electric driving unit 33 in ensuring the stability of the operation, similarly to the electric driving unit 19.

As shown in FIG. 2, the electric blower unit 35 has a sub-heat exchanger 35a, an electric blower 35b, and a drive circuit 35c of the electric blower 35b. The air flows in from the outside of the aircraft and passes through the heat exchanger 31, and then passes through the sub-heat exchanger 35a. After that, the air is sucked by the electric blower 35b. The drive circuit 35c is arranged adjacent to the sub-heat exchanger 35a. Note that a pathway through which the air passes may be reverse to the above-mentioned one. That is, the air may pass through the heat exchanger 31 after having passed through the sub-heat exchanger 35a. In this case, the electric blower 35b sucks the air having passed through the heat exchanger 31.

The sub-heat exchanger 35a has fins for heart transfer (not shown) that makes contact with air (outboard air) after having passed through the heat exchanger 31. The electric blower 35b has an impeller 35e and an electric motor 35d that rotates the impeller 35e. When the impeller 35e is rotated by the electric motor 35d, the air after having passed through the sub-heat exchanger 35a is sucked into the electric blower 35b, is passed through a diffuser passage (not shown), and is discharged. The drive circuit 35c has the high-voltage and high-frequency switching devices (for example, the IGBT and the MOSFET and the like) that generate large heat, similarly to the drive circuit of the electric motor of the electric driving unit 33.

Accordingly, in the sub-heat exchanger 35a, heat exchange is performed between the drive circuit 35c that is adjacent to the sub-heat exchanger 35a and the air (the outboard air) that passes through the inside of the sub-heat exchanger 35a. The air (the outboard air) receives heat from the drive circuit 35c while passing through the sub-heat exchanger 35a, is then compressed by the electric blower 35b, and is discharged to the outside of the aircraft from the exhaust port 27 of the air passage 23.

A controller 37 is, for example, a digital controller which controls equipment of the aircraft 1. The controller 37 controls (determines) rotational speed of the electric motors 7a, 13a located in the passenger cabin 5, the cargo compartment 7, and the landing gear cavity 13 which have been described above. The controller 37 may be the one that controls the entire of the aircraft 1, or may be the one that controls part of the aircraft 1. The controller 37 in the latter example controls one of systems (for example, the system of the environmental control (not shown), the system of the front landing gear (not shown) and the like) that are dispersively arranged in the aircraft 1.

The controller 37 sends commands relevant to the rotational speed of the electric motors 7a, 13a to the drive circuits (not shown) of the corresponding electric driving units 19, 33. The drive circuits that receive these commands drive the electric motors 7a, 13a so as to rotate at the commanded rotational speed.

Incidentally, the drive circuits (not shown) of the electric driving units 19, 33 can know power consumptions of the electric motors 7a, 13a and the drive circuits themselves from operational condition when the drive circuits (not shown) drive the corresponding electric motors 7a, 13a.

Then, elements such as electronic devices and the like included in the electric driving units 19, 33, in the electric motors 7a, 13a and the drive circuits thereof, can dissipate the heat via the heat exchangers 17, 31. Accordingly, the power consumptions of the elements can be used as indices of the amounts of heat generation which are generated there.

Accordingly, in the present embodiment, the drive circuits 21c, 35c of the electric blower units 21, 35 that correspond to the electric driving units 19, 33 is notified, directly or via the controller 37, of the power consumptions of the above-mentioned elements, from the drive circuits of the electric motors 7a, 13a.

The respective drive circuits 21c, 35c that receive notifications of the power consumptions determine the rotational speed of the electric motors 21d, 35d such that the flow rates of the ventilation air and the air (the outboard air) that pass through the heat exchangers 17, 31 become enough flow rates to remove heat, which amount are estimated from the notified power consumptions, and drive the electric motors 21d, 35d by the determined rotational speed.

That is, the control of the rotational speed of the electric motors 21d, 35d by the drive circuits 21c, 35c optimize amounts of exhaust heat to the outside of the aircraft by the ventilation air and the air (the outboard air), which are sucked and discharged by the electric blowers 21b, 35b, in accordance with the amounts of heat generation of the electric driving units 19, 33 to be transferred to the heat exchangers 17, 31.

If the flow rates of the ventilation air and the outboard air that pass through the heat exchangers 17, 31 cannot be individually controlled, it is necessary to set the flow rates of the ventilation air and the outboard air that pass through the heat exchangers 17, 31, in accordance with maximum amounts of heat generation of the electric driving units 19, 33. Accordingly, in a state where the amounts of heat generation of the electric driving units 19, 33 are lower than the maximum amounts of heat generation, the electric motors 21d, 35d are driven at the high rotational speed beyond necessity to the extent that the electric driving units 19, 33 are excessively cooled by the heat exchangers 17, 31 and the electric power is uselessly consumed.

However, in the present embodiment, the flow rates of the ventilation air and the outboard air which pass through the heat exchangers 17, 31 are controlled to flow rates at which heat amounts corresponding to the amounts of heat generation of the electric driving units 19, 33 are transferred to the heat exchangers 17, 31. Accordingly, the cooling of the electric driving units 19, 33 is efficiently performed.

That is, in the aircraft 1 of the present embodiment, the drive circuits 21c, 35c of the electric blowers 21b, 35b function as controllers that control the rotational speed of the electric blowers in accordance with the amounts of heat generation of the electric driving units. Note that the controller 37 may receive the notifications of the power consumptions, may estimate the rotational speed of the electric motors 21d, 35d so as to obtain the flow rates that are commensurate with heat exchange for the amounts of heat generation that are estimated from the power consumptions notified of and may notify the drive circuits 21c, 35c of the electric blowers 21b, 35b of the estimated rotational speed. In this case, the controller 37 functions as the controllers that control the rotational speed of the electric blowers in accordance with the amounts of heat generation of the electric driving units. The drive circuits 21c, 35c drive the electric blowers 21b, 35b at the rotational speed notified of from the controller 37.

In the aircraft 1 of the present embodiment, the heat exchangers 17, 31 are adjacent to the corresponding electric driving units 19, 33 and the electric blowers 21b, 35b rotate at the rotational speed according to the amounts of heat generation of the corresponding electric driving units 19, 33. The air (the ventilation air and the outboard air) sucked by the electric blowers 21b, 35b pass through the heat exchangers 17, 31 that are adjacent to the corresponding electric driving units 19, 33.

Air cooling capacities of the heat exchangers 17, 31 are individually adjusted by control of the rotational speed of the electric blowers 21b, 35b according to the amounts of heat generation of the corresponding electric driving units 19, 33. That is, the electric driving units 19, 33 of the aircraft can be efficiently cooled with the air refrigerants. Accordingly, it isn't necessary to maintain a large air cooling capacity that includes a certain margin as the entire cooling system for the electric driving units 19, 33, assuming a case and the like where, for example, the amounts of heat generation of all of the electric driving units 19, 33 increases.

Accordingly, in a case where the amounts of heat generation of the respective electric driving units 19, 33 increase, the air cooling capacity of the entire system can be kept at an appropriate capacity according to the situations. The cooling of the electric driving units 19, 33 by using the air refrigerant can be efficiently performed, by increasing the air cooling capacity of the entire cooling system for the electric driving units 19, 33 by a required amount, then by returning it to the original air cooling capacity when an increase in amount of heat generation of the respective electric driving units 19, 33 is dissolved, and the like.

In addition, in the aircraft 1 of the present embodiment, the ventilation air that is used for cooling of the electric driving unit 19 in the electric room 9 flows from the passenger cabin 5 and passes through the heat exchanger 17. The flow rate of the ventilation air through the heat exchanger 17 is determined not depending on a ventilation amount of the air in the passenger cabin 5 but depending on the amount of heat generation according to the power consumption of the electric driving unit 19.

Accordingly, even when the ventilation amount of the air in the passenger cabin 5 is set to a low value so as not to exceed a required amount, the flow rate of the ventilation air from the passenger cabin 5 can be controlled to a flow rate that is more than a minimum required ventilation amount and thus the flow rate required for cooling of the electric driving unit 19 can be ensured. Therefore, the electric driving unit 19 can be prevented from not being sufficiently cooled because the flow rate of the ventilation air that passes through the heat exchanger 17 is insufficient.

In addition, in the aircraft 1 of the present embodiment, the ventilation air and the air that has flown into the landing gear cavity 13 pass through the sub-heat exchangers 21a, 35a that are adjacent to the drive circuits 21c, 35c of the electric blowers 21b, 35b. Thereby, heat generated from the drive circuits 21c, 35c can be exhausted via the sub-heat exchangers 21a, 35a.

Accordingly, heat generated in the drive circuits 21c, 35c of the electric blowers 21b, 35b that are required to cool the respective electric driving units 19, 33 with the ventilation air and the outboard air can also be efficiently cooled with the ventilation air and the outboard air together with heat generated in the electric driving units 19, 33.

Note that the above-mentioned embodiment is applicable to a case where cooling of the electric driving unit that has been arranged in a pressurized region that is to be pressurized of the aircraft 1 such as the passenger cabin 5 is performed, without being limited to a case where cooling of the electric driving unit 19 that is arranged in the electric room 9 is performed.

Likewise, the above-mentioned embodiment is also applicable to a case where the cooling of the electric driving unit that has been arranged in an unpressurized region that is to be unpressurised of the aircraft 1 is performed, without being limited to a case where the cooling of the electric driving unit 33 that is arranged in the landing gear cavity 13 is performed.

Furthermore, in the above-mentioned embodiment, the outboard air flowed into the landing gear cavity 13 while the door (not shown) of the landing gear cavity 13 is being opened, was sucked into the electric blower unit 35, and cooled the electric driving unit 33 of the landing gear cavity 13 that is an unpressurized cabin. However, ram air that is taken from the outside of the aircraft can be also used for cooling of the electric driving unit in the unpressurized cabin.

Figure 3:
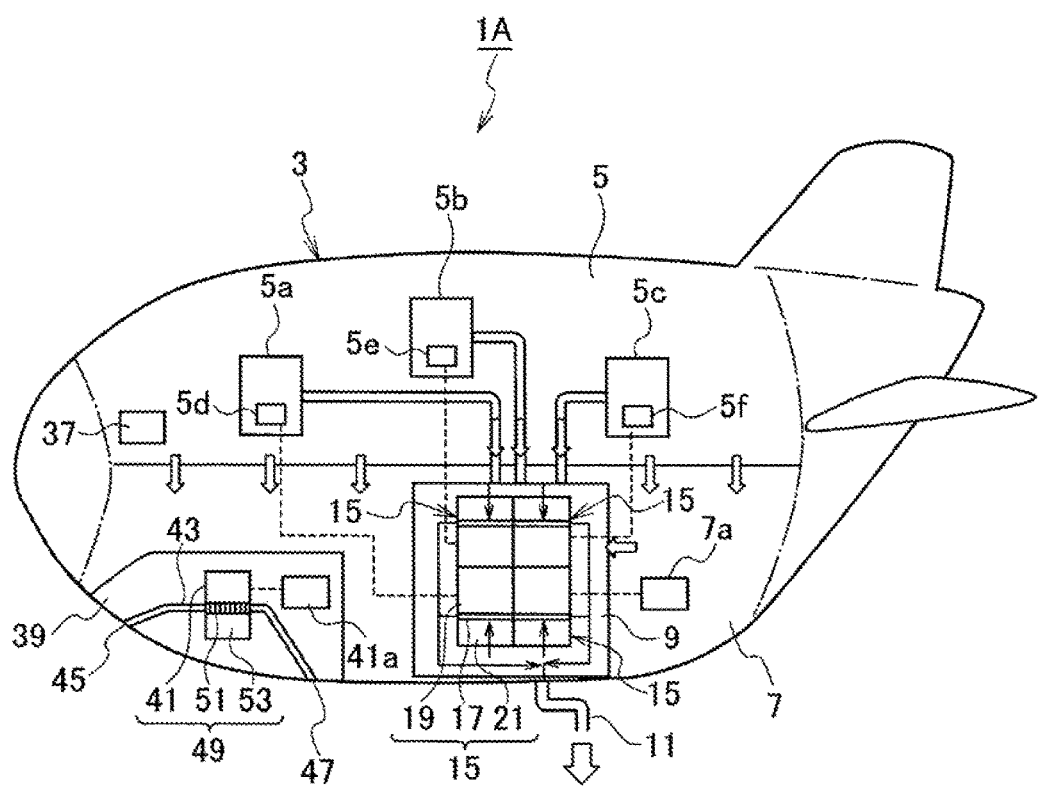
FIG. 3 is an explanatory diagram showing a system for cooling an electric driving unit of an aircraft according to a second embodiment of the present disclosure.

In an aircraft 1A of a second embodiment shown in an explanatory diagram of FIG. 3, an electric driving unit 41 that is used for, for example, flight control of the aircraft 1A is arranged in an unpressurized area 39 (corresponding to an unpressurized region in the claims) that has been provided in the fuselage 3. Note that, in FIG. 3, illustration of the landing gear cavity 13 and an internal structure thereof is omitted.

The unpressurized area 39 is provided with a ram air passage 43. The ram air passage 43 connects a front intake port (a ram air intake) 45 with a rear exhaust port 47 of the unpressurized area 39. The ram air that is taken from the intake port 45 during flight of the aircraft 1A flows through the ram air passage 43.

In addition, a cooling unit 49 is arranged in the unpressurized area 39. The cooling unit 49 is the one that the electric driving unit 41 and an electric blower unit 53 are arranged adjacent to each other via a heat exchanger 51.

The heat exchanger 51 has fins for heat transfer (not shown) that makes contact with the ram air that is induced through the intake port 45 by the ram air passage 43. The heat exchanger 51 performs heat exchange between the electric driving unit 41 that is adjacent to the heat exchanger 51 and the ram air that passes through the inside of the heat exchanger 51. The ram air receives heat from the electric driving unit 41 while passing through the heat exchanger 51 and is then induced into the electric blower unit 53.

The electric driving unit 41 includes, for example, a drive circuit (not shown) of an electric motor 41a that drives a flap (not shown) of a main wing. The electric driving unit 41 may be the electric motor 41a itself or may include both of the electric motor 41a and the drive circuit thereof, similarly to the electric driving units 19, 33. Since the electric motor 41a and the drive circuit thereof respectively generate large heat, obtaining sufficient cooling is also mandatory for the electric driving unit 41 in ensuring the stability of the operation, similarly to the electric driving units 19, 33.

As shown in FIG. 2, the electric blower unit 53 has a sub-heat exchanger 53a, an electric blower 53b, and a drive circuit 53c of the electric blower 53b. The ram air passes through the sub-heat exchanger 53a after having passed through the heat exchanger 51. Thereafter, the ram air is sucked by the electric blower 53b. The drive circuit 53c is arranged adjacent to the sub-heat exchanger 53a. Note that a pathway through which the ram air passes may be reverse to the above-mentioned one. That is, the ram air may pass through the heat exchanger 51 after having passed through the sub-heat exchanger 53a. In this case, the electric blower 53b sucks the ram air that has passed through the heat exchanger 51.

The sub-heat exchanger 53a has fins for heat transfer (not shown) which makes contact with the ram air after having passed through the heat exchanger 51. The electric blower 53b has an impeller 53e and an electric motor 53d that rotates the impeller 53e. When the impeller 53e is rotated by the electric motor 53d, the ram air after having passed through the sub-heat exchanger 53a is sucked into the electric blower 53b, is passed through a diffuser passage (not shown) and is discharged. The drive circuit 53c has the high-voltage and high-frequency switching devices (for example, the IGBT, the MOSFET and the like) that generate large heat, similarly to the drive circuit of the electric motor of the electric driving unit 41.

Accordingly, in the sub-heat exchanger 53a, heat exchange is performed between the drive circuit 53c that is adjacent to the sub-heat exchanger 53a and the ram air that passes through the inside of the sub-heat exchanger 53a. The ram air receives heat from the drive circuit 53c while passing through the sub-heat exchanger 53a and is then compressed by the electric blower 53b and is discharged to the outside of the aircraft from the exhaust port 47 of the ram air passage 43.

A rotational speed of the electric motor 41a of the above-mentioned unpressurized area is also determined by the controller 37, similarly to the rotational speed of the electric motors 7a, 13a of the passenger cabin 5 and the cargo compartment 7, the landing gear cavity 13. The controller 37 sends a command relevant to the determined rotational speed of the electric motor 41a to the drive circuit (not shown) of the corresponding electric driving unit 41.

The drive circuit that receives this command drives the electric motor 41a so as to rotate at the commanded rotational speed.

At this time, the drive circuit (not shown) of the electric driving unit 41 knows the power consumptions of the electric motor 41a and the drive circuit itself from operational condition when the drive circuit (not shown) drives the electric motor 41a. Then, the drive circuit notifies the drive circuit 53c of the electric blower unit 53 of the power consumption corresponding to heat that is transferred via the heat exchanger 51, as an index of the amount of heat generation directly or via the controller 37.

The drive circuit 53c that receives the notification of the power consumption determines the rotational speed of the electric motor 53d such that the flow rate of the ram air that passes through the heat exchanger 51 becomes the enough flow rate to remove heat, which amount is estimated from the notified power consumptions, and drives the electric motor 53d by the determined rotational speed.

In this way, the control of the rotational speed of the electric motor 53d by the drive circuit 53c optimizes an amount of exhaust heat to the outside of the aircraft by the ram air, which is sucked and discharged by the electric blower 53b, in accordance with the amount of heat generation of the electric driving unit 41 to be transferred to the heat exchanger 51.

If the flow rate of the ram air that passes through the heat exchanger 51 cannot be individually controlled, it is necessary to set the flow rates of the ram air that passes through the heat exchanger 51, in accordance with a maximum amount of heat generation of the electric driving unit 41. Accordingly, in a state where the amount of heat generation of the electric driving unit 41 is lower than the maximum amount of heat generation, the electric motor 53d is driven at the high rotational speed beyond necessity to the extent that the electric driving unit 41 is cooled excessively by the heat exchanger 51 and the electric power is uselessly consumed.

However, in the present embodiment, the flow rate of the ram air that passes through the heat exchanger 51 is controlled to the flow rate at which a heat amount corresponding to the amount of heat generation of the electric driving unit 41 is transferred to the heat exchanger 51. Accordingly, the cooling of the electric driving unit 41 is efficiently performed.

That is, in the aircraft 1A of the present embodiment, the drive circuit 53c of the electric blower 53b functions as a controller that controls the rotational speed of the electric blower in accordance with the amount of heat generation of the electric driving unit together with the drive circuits 21c, 35c of the electric blowers 21b, 35b. Note that the controller 37 may receive the notifications of the power consumptions, may estimate the rotational speed of the electric motors 21d, 35d, 53d so as to obtain the flow rates that are commensurate with heat exchange for the amounts of heat generation that are estimated from the power consumptions notified of and may notify the drive circuits 21c, 35c, 53c of the electric blowers 21b, 35b, 53b of the estimated rotational speed. In this case, the controller 37 functions as the controllers that control the rotational speed of the electric blowers in accordance with the amounts of heat generation of the electric driving units. The drive circuits 21c, 35c, 53c drive the electric blowers 21b, 35b, 53b at the rotational speed notified of from the controller 37.

The same advantageous effect as that of the aircraft 1 of the already described embodiment can be obtained also by the aircraft 1A of the present embodiment, constituted in this way.

In addition, in the aircraft 1A of the present embodiment, the outboard ram air that has been taken into the ram air passage 43 from the intake port 45 can be induced to the heat exchanger 51 that is adjacent to the electric driving unit 41 in the unpressurized area 39, without going through the pressurized regions such as the passenger cabin 5 and the cargo compartment 7 (including the electric room 9).

Accordingly, the air at the flow rate that is sufficient for the cooling of the electric driving unit 41 can be made to pass through the heat exchanger 51 by sucking the ram air by the electric blower 53b by an amount that is insufficient at a pressure of the ram air that has been taken in from the intake port 45. Therefore, a load on the electric blower 53b for making the ram air of the required flow rate pass through the heat exchanger 51 can be alleviated.

Note that, although in the above-mentioned respective embodiments, the power consumptions of the electric motors 7a, 13a, 41a and the drive circuits (not shown) of the electric driving units 19, 33, 41 were used as indices of the amounts of heat generation of the electric driving units 19, 33, 41. However, temperatures of the electric motors 7a, 13a, 41a and the drive circuits (not shown), command values of the rotational speed of the electric motors 7a, 13a, 41a that are determined by the controller 37, and actually measured rotational speed of the electric motors 7a, 13a, 41a may be used as the indices of the amounts of heat generation of the electric driving units 19, 33, 41.

In addition, a command value of operation of the compressor (not shown) and the like of the environmental condition system, command values of a landing gear actuator stroke and a rotational speed of the front wheel (not shown), and command values of operation and the like of the flap (not shown) of the main wing, all of which would become preconditions in determining command values of the rotational speed of the electric motors 7a, 13a, 41a may be used as the indices of the amounts of heat generation of the electric driving units 19, 33, 41.

Likewise, actually measured values of operation of the compressor (not shown) and the like of the environmental condition system, actually measured values of the landing gear actuator stroke and the rotational speed of the front wheel (not shown), and actually measured values of the operation and the like of the flap (not shown) of the main wing, all of which would generate as a result of rotation of the electric motors 7a, 13a, 41a can also be used as the indices of the amounts of heat generation of the electric driving units 19, 33, 41.

Furthermore, although in the above-mentioned respective embodiments, description has been made by taking, as examples, a civil aircraft that has the passenger cabin 5, the cargo compartment 7, the electric room 9, and the landing gear cavity 13, and a civil aircraft that further includes the unpressurized area 39, the present disclosure is widely applicable to aircrafts regardless of a military plane or the civil aircraft, and a passenger plane or a cargo plane.

What is claimed is:
1. A cooling system for an aircraft, comprising:
at least one heat exchanger arranged adjacent to at least one electric driving unit arranged in the aircraft, the at least one heat exchanger configured to perform heat exchange between the at least one electric driving unit and air flowing through the at least one heat exchanger;

an electric blower configured to suck the air from the at least one heat exchanger and configured to exhaust the air to an outside of the aircraft; and a controller configured to control a rotational speed of the electric blower in accordance with a power consumption of the at least one electric driving unit as an index of an amount of heat generation of the at least one electric driving unit to obtain a flow rate of the air that is commensurate with heat exchange by the at least one heat exchanger for the amount of heat generation.

2. The cooling system according to claim 1, wherein
the at least one heat exchanger includes a heat exchanger arranged in a pressurized region of the aircraft together with the at least one electric driving unit, and
a ventilation passage is provided to induce ventilation air as the air into the heat exchanger arranged in the pressurized region.

3. The cooling system according to claim 2, further comprising:
a drive circuit for the electric blower; and
a sub-heat exchanger arranged adjacent to the drive circuit, the sub-heat exchanger configured to perform heat exchange with the drive circuit, wherein
the electric blower is configured to suck the air through one of the at least one heat exchanger and the sub-heat exchanger via the other of the at least one heat exchanger and the sub-heat exchanger and is configured to discharge the air to the outside of the aircraft.

4. The cooling system according to claim 3, wherein
the controller controls the rotational speed of the electric blower to optimize an amount of exhaust heat to the outside by the air sucked and discharged by the electric blower in accordance with the amount of heat generation of the at least one electric driving unit.

5. The cooling system according to claim 2, wherein
the controller controls the rotational speed of the electric blower to optimize an amount of exhaust heat to the outside by the air sucked and discharged by the electric blower in accordance with the amount of heat generation of the at least one electric driving unit.

6. The cooling system according to claim 1, wherein
the at least one heat exchanger includes a heat exchanger arranged in an unpressurized region of the aircraft together with the at least one electric driving unit, and
an air passage is provided to induce outboard air or ram air as the air into the heat exchanger arranged in the unpressurized region.

7. The cooling system according to claim 6, further comprising:
a drive circuit for the electric blower; and
a sub-heat exchanger arranged adjacent to the drive circuit, the sub-heat exchanger configured to perform heat exchange with the drive circuit, wherein
the electric blower is configured to suck the air through one of the at least one heat exchanger and the sub-heat exchanger via the other of the at least one heat exchanger and the sub-heat exchanger and is configured to discharge the air to the outside of the aircraft.

8. The cooling system according to claim 7, wherein
the controller controls the rotational speed of the electric blower to optimize an amount of exhaust heat to the outside by the air sucked and discharged by the electric blower in accordance with the amount of heat generation of the at least one electric driving unit.

9. The cooling system according to claim 6, wherein
the controller controls the rotational speed of the electric blower to optimize an amount of exhaust heat to the outside by the air sucked and discharged by the electric blower in accordance with the amount of heat generation of the at least one electric driving unit.

10. The cooling system according to claim 1, further comprising:
a drive circuit for the electric blower; and
a sub-heat exchanger arranged adjacent to the drive circuit, the sub-heat exchanger configured to perform heat exchange with the drive circuit, wherein
the electric blower is configured to suck the air through one of the at least one heat exchanger and the sub-heat exchanger via the other of the at least one heat exchanger and the sub-heat exchanger and is configured to discharge the air to the outside of the aircraft.

11. The cooling system according to claim 10, wherein
the controller controls the rotational speed of the electric blower to optimize an amount of exhaust heat to the outside by the air sucked and discharged by the electric blower in accordance with the amount of heat generation of the at least one electric driving unit.

12. The cooling system according to claim 1, wherein
the controller controls the rotational speed of the electric blower to optimize an amount of exhaust heat to the outside by the air sucked and discharged by the electric blower in accordance with the amount of heat generation of the at least one electric driving unit.

* * * * *